(12) United States Patent
Moert et al.

(10) Patent No.: US 7,230,241 B2
(45) Date of Patent: Jun. 12, 2007

(54) METHOD FOR MATCHING TWO MEASUREMENT METHODS FOR MEASURING STRUCTURE WIDTHS ON A SUBSTRATE

(75) Inventors: Manfred Moert, Dresden (DE); Thomas Hingst, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/052,467

(22) Filed: Feb. 8, 2005

(65) Prior Publication Data

US 2005/0189489 A1 Sep. 1, 2005

(30) Foreign Application Priority Data

Feb. 9, 2004 (DE) ............... 10 2004 006 258

(51) Int. Cl.
  *G01N 23/00* (2006.01)
  *H01L 21/66* (2006.01)
(52) U.S. Cl. ............ 250/307; 250/306; 250/311; 250/310; 382/145
(58) Field of Classification Search ............ None
  See application file for complete search history.

(56) References Cited

U.S. PATENT DOCUMENTS

| 6,566,655 | B1 * | 5/2003 | Choo et al. ............ 250/310 |
| 6,943,900 | B2 * | 9/2005 | Niu et al. ............ 356/625 |
| 2002/0090744 | A1 | 7/2002 | Brill et al. |
| 2003/0204326 | A1 | 10/2003 | Opsal et al. |
| 2005/0100205 | A1 * | 5/2005 | Shishido et al. ............ 382/145 |

FOREIGN PATENT DOCUMENTS

| WO | WO 02/13 232 A2 | 2/2002 |
| WO | WO 03/073 494 A2 | 9/2003 |
| WO | WO 03/074 995 A2 | 9/2003 |
| WO | WO 03/081 662 A1 | 10/2003 |

* cited by examiner

*Primary Examiner*—Nikita Wells
(74) *Attorney, Agent, or Firm*—Morrison & Foerster LLP

(57) ABSTRACT

The invention relates to a method for matching a first measurement method for measuring structure widths of trapezoidally tapering structures on a substrate wafer to a second measurement method for measuring the structure widths. This is performed in order to obtain measured values for the structure width which are comparable with one another. The second measurement method is suitable for measuring a second structure width at an unknown second height above the surface of the substrate, and the first measurement method is suitable for measuring a first structure width at a first height, the first height being settable.

4 Claims, 2 Drawing Sheets

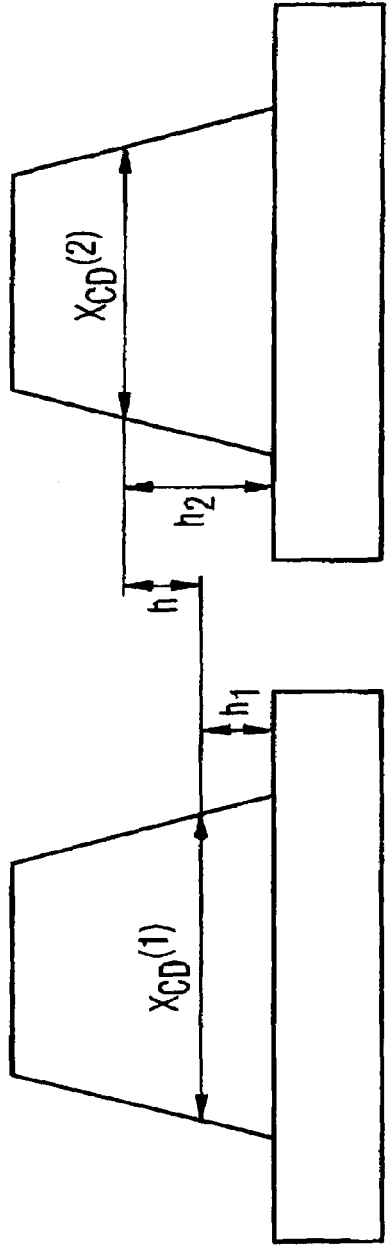
FIG 1
FIG 2
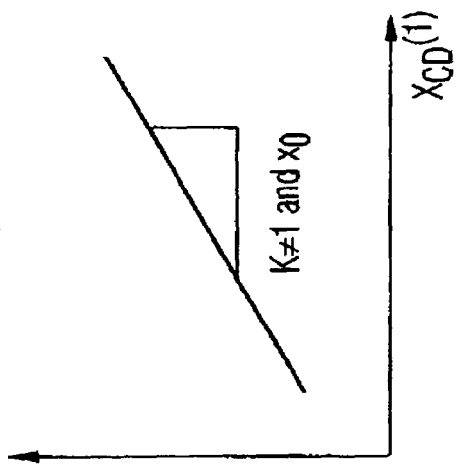
FIG 3  $x_{CD}^{(2)} = k \cdot x_{CD}^{(1)} + x_0$

METHOD FOR MATCHING TWO MEASUREMENT METHODS FOR MEASURING STRUCTURE WIDTHS ON A SUBSTRATE

CLAIM FOR PRIORITY

This application claims the benefit of priority to German Application 10 2004 006 258.7, filed on Feb. 9, 2004, the contents of which are hereby incorporated by reference.

TECHNICAL FIELD OF THE INVENTION

The invention relates to a method for matching two measurement methods for measuring structure widths, in particular for measuring structure widths of trapezoidally tapering structures.

BACKGROUND OF THE INVENTION

When measuring structure widths of a structure with integrated circuits that is applied on a substrate surface of a substrate, discrepancies occur if structure widths are measured by means of different measurement methods or measuring devices. The reason for this is that the structure widths are measured at different heights with regard to the substrate surface. In addition to the method-specific or device-specific measured value difference, this generally leads to a mutually deviating behavior of the measured value increase, particularly in the case of the trapezoidal structures, if the sidewall angle of the trapezoidal structure depends on the structure width. This proves to be particularly disadvantageous for the required correspondence given a multiplicity of different measuring devices and measurement methods within high-volume production, in which case the measured values obtained are intended to be comparable with one another.

In particular, measured value differences occur if structure widths are determined with the aid of an electron beam method and with the aid of an optical method.

To date, it has been possible to carry out the systematic measured value adjustment by comparison with cross-sectional recordings of the structure, e.g. by means of scanning electron microscopy. What is disadvantageous in this case is that the high preparation outlay for producing cross sections of the structure to be examined is time-consuming. Moreover, in the case of small structure widths, (less than 100 nm), evaluation errors may occur during measurement of the cross-sectional recordings created by the scanning electron microscope.

SUMMARY OF THE INVENTION

The present invention provides a method for matching two different measurement methods for measuring feature sizes, which method can be carried out in a simple manner.

A first aspect of the present invention provides a method for matching a first measurement method for measuring structure widths of trapezoidally tapering structures on a substrate wafer to a second measurement method for measuring the structure widths. This serves for obtaining measured values for the structure width which are comparable with one another. The second measurement method is suitable for measuring a second structure width at an unknown second height above the surface of the substrate. By contrast, the first measurement method is suitable for measuring a first structure width at a first height, the first height being settable. Firstly, the first structure width of a test structure is measured by means of the first measurement method at a predetermined first height which is set. During this measurement method, at least one further parameter can be determined with the aid of which the trapezoidal form of the test structure is completely described. With the aid of the second measurement method, the second structure width of the test structure is measured at an unknown height with regard to the substrate surface on which the measurement structure is applied. The second height is determined from the first structure width, the predetermined height of the second structure width and also from at least one further parameter. The first height of the first measurement method is set to the value of the second height in order to match the first measurement method to the second measurement method.

The method according to the invention, in one embodiment, provides for a measurement method during which a structure width can be measured at a specific, settable height to be matched to a measurement method that measures the structure width at an unknown height. This serves for using both measurement methods in parallel in high-volume production, so that the same measurement method does not have to be used for measurements. In this case, the measurement height of the first measurement method, during which the structure height can be set, is matched such that the measurement height at which the first measurement method effects measurement is matched to the measurement height of the second measurement method. The second height is determined beforehand from the structure widths determined during the first and second measurement methods carried out beforehand.

As a result, two measurement methods are obtained during which the measurement height at which the first measurement method effects measurement can be set, so that the first measurement method is matched to the second measurement method. If both measurement methods are matched to one another, then the structure widths measured by them are comparable, so that these can be used alongside one another for measurement and monitoring of structure widths in high-volume production.

Preferably, the first measurement method is an optical measurement method, in particular a scatterometric measurement method based on reflectometry or ellipsometry, which permits the measurement of a structure width at a specific height, and the second measurement method is a measurement method of electron beam microscopy, which measures the structure width at an unknown height above the substrate surface.

The at least one parameter for determining the trapezoidal form of the test structure may expediently comprise the sidewall angle and/or the structure width at a further height. What is essential in determining the further parameter is that this parameter is suitable for unambiguously determining the trapezoidal form. The known trapezoidal form of the structure to be measured makes it possible to determine the height at which the second measurement method has measured the second structure width.

The determination of the at least one further parameter in the first measurement method may be based on an underlying model which is suitable for deducing the underlying cross-sectional structure of the test structure to be measured from one or a plurality of measured values at a specific measurement height.

BRIEF DESCRIPTION OF THE DRAWINGS

Preferred embodiments of the invention are explained in more detail below with reference to the accompanying drawings, in which:

FIG. 1 shows measurement of a structure width of a trapezoidal structure on a substrate with the aid of an optical method.

FIG. 2 shows measurement of the structure width with the aid of an electron beam microscope method.

FIG. 3 shows a representation of a correlation function where structure widths measured with the aid of an electron microscope measurement method and alternatively an optical measurement method can be converted into one another.

DETAILED DESCRIPTION OF THE INVENTION

Figure 4:
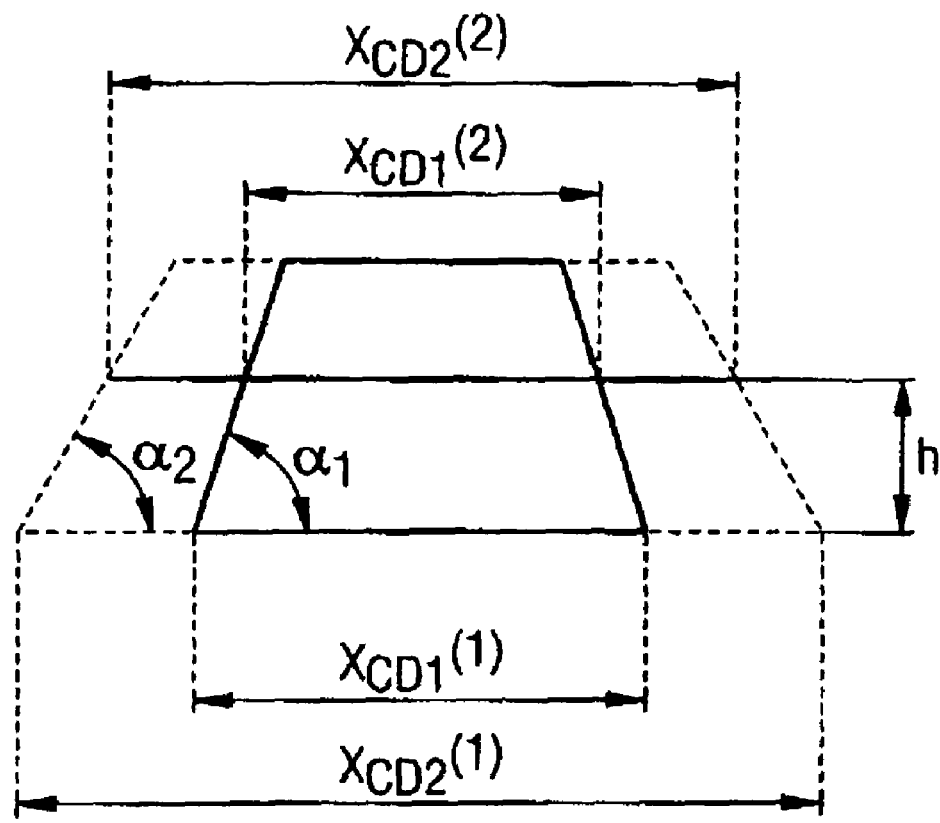
FIG. 4 shows a variation of a sidewall angle depending on the structure width.

During the production methods of semiconductor technology, structures that form integrated circuits are produced on a substrate. During the production of structures that are situated on the substrate surface and project from the latter, usually trapezoidal cross sections of the structures form, i.e. structures that taper with increasing height above the substrate surface.

In order to monitor the production processes, it is essential to measure the structure widths of such structures and the structure widths of test structures are therefore checked regularly by measurement. The measurement results serve for evaluating one of the preceding process steps and are crucial input parameters for subsequent processes with regard to the lithography and etching technology.

Since a large number of wafers are processed in parallel during the production of integrated circuits, it can happen that the measurement of the structure widths is carried out by means of different measurement methods or by means of different measuring apparatuses. Although the measurement methods used are specifically very precise, discrepancies occur between the measurement methods with regard to the altitude. The altitude specifies the height of the structure above the substrate surface at which the structure width is measured. If a structure is measured at different heights, then different measurement results occur on account of the trapezoidal cross section of the structure.

Thus, FIG. 1 represents the measurement of the structure width with the aid of an optical method, e.g. with the aid of a scatterometric method. The double arrow designated by $X_{CD}^{(1)}$ specifies the structure width at a first height $h_1$.

FIG. 2 represents the measurement of the structure width $X_{CD}^{(2)}$ at a second height $h_2$, the measurement being carried out with the aid of an electron beam microscopy method, e.g. CDSEM. With the measurement by means of the electron beam microscopy method, it is usually possible to determine the structure width $X_{CD}^{(2)}$ at a specific height $h_2$, the height $h_2$ not being known exactly. It should be pointed out that the superscripted indices $^{(1)}$ and $^{(2)}$ identify the different measurement methods.

The first and second heights $h_1$, $h_2$ are usually different, so that different values for the structure width are determined for the same measured structure.

In the case of structures having different widths, when comparing the structure widths which have been measured by means of different measurement methods, in addition to an offset produced inter alia from the different measurement height of the measurement methods, a deviation in the linear correlation between the two measured values is also produced. This is illustrated in the function illustration of FIG. 3. It is evident that, contrary to expectations, the rise in the correlation straight line for the measured values recorded by means of the two measurement methods produces a gradient not equal to 1, which is due to the variation of the trapezoidal structure, depending on the structure width.

As illustrated in FIG. 4, it is evident that the sidewall angle $\alpha$ is all the greater, the smaller the structure width $X_{CD}$ of the structure to be measured. Thus, the sidewall angle is $\alpha_1$ in the case of the structure width $X_{CD1}$ and the sidewall angle is $\alpha_2$ in the case of a structure width $X_{CD2}$. Frequently observed process variations also produce structures in which the upper side length remains constant and the lower side length of the trapezoid is extended. The subscripted numerals $_1$ and $_2$ designate different structure widths.

If the measured values of the two measurement methods are compared and plotted relative to one another, then a linear behavior is produced, and also a variation of the sidewall angle $\alpha$.

In this case, the gradient k depends on the height difference h between the measurement height $h_1$ of the first measurement method and the measurement height $h_2$ of the second measurement method. The following results:

$$x_{CD}^{(2)} = K \cdot X_{CD}^{(1)} + x_0,$$

where $x_0$ is a fundamental offset between the two measurement methods which is caused for example by charging during the electron beam microscope measurement method, and k is a correlation factor between the two measurement methods.

An adjustment has been effected if the measurement position has been adapted in such a way that the correlation factor, i.e. the gradient of the straight line, virtually amounts to k=1 and the constant offset $X_0$ occurs. The difference between the structure widths measured by means of the different methods is no longer dependent on the structure width present, but rather is always constant.

During the optical measurement method, besides the structure width, it is also possible to obtain additional information about the sidewall angle $\alpha$ and the like in order to completely describe the trapezoidal structure geometrically. The positional difference in the measurement height $h_1$, $h_2$ between the two measurement methods can be determined therefrom, and subsequently be systematically adapted by altering the evaluation parameters.

The cotangent of the sidewall angle $\alpha$ depends as follows on the structure width measured by means of the first measurement method:

$$\cot\alpha = \frac{\frac{1}{2}\left(x_{CD}^{(1)} - x_{CD}^{(2)}\right)}{h}.$$

The following is obtained from the linearity described in the above equation:

$$\cot\alpha = \frac{\frac{1}{2}\left(x_{CD}^{(1)} - k \cdot x_{CD}^{(1)} - x_0\right)}{h},$$

or summarized $$\cot\alpha = \frac{1-k}{2h} \cdot x_{CD}^{(1)} - \frac{x_0}{2h}.$$

The above-described type of transformation of structures having different structure widths thus results in a new direct proportionality between the cotangent α and the value of the structure width $x_{CDX}^{(1)}$ measured by means of the first measurement method.

By evaluating the gradient and/or the ordinate section $y_0$, it is possible to calculate the height difference of the measurement position.

$$m = \frac{1-k}{2h} \quad y_0 = \frac{x_0}{2h}$$
$$\Leftrightarrow h = \frac{1-k}{2m} \quad \Leftrightarrow h = \frac{x_0}{2y_0}$$

Consequently, from knowledge of the relationship between the cotangent α and the value of the structure width $x_{CD}^{(1)}$ measured by means of the first measurement method, it is possible to determine the height difference h between the measured values for the structure widths which have been measured by means of the first and the second measurement method.

Figure 5:
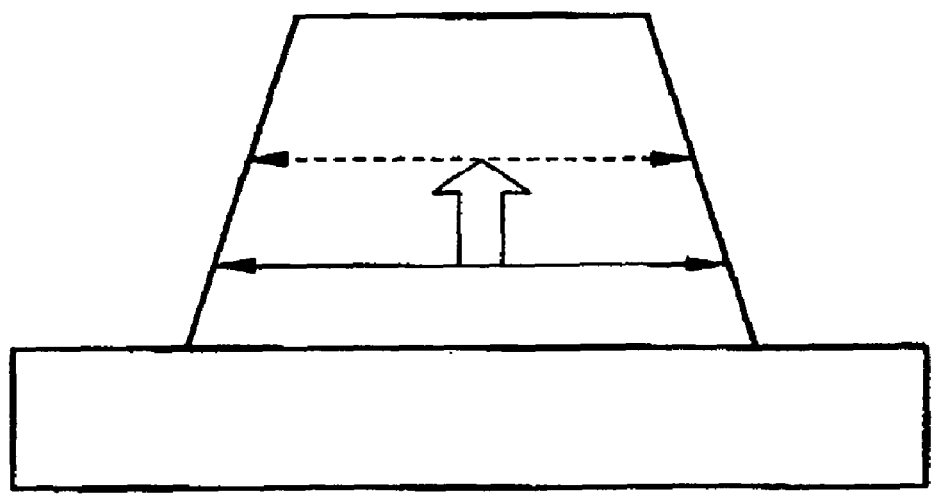
FIG. 5 shows adaptation of the optical measurement method to the electron microscope measurement method.

In order to match the two measurement methods to one another, it is therefore possible, as is made clear in FIG. 5, to set the first measurement method, which is an optical measurement method, in such a way that the optical measurement method measures the structure width $X_{CD}^{(1)}$ at the same measurement height $h_1 = h_2$ at which the second measurement method, the electron microscope measurement method, also measures the structure width $X_{CD}^{(2)}$. As a result of matching the two measurement methods, it is possible to use the latter in parallel in the production of integrated modules, e.g. for monitoring of individual process steps and the like.

The procedure described above can be realized as software which supports the matching of the measurement methods.

What is claimed is:

1. A method of setting a measuring height of a first measurement method for measuring structure widths of trapezoidally tapering structures on a substrate wafer to a measuring height of a second measurement method for measuring the structure widths to obtain measured values for the structure width which are comparable with one another, in the setting procedure the second measurement method measuring a second structure width at an unknown second height above a surface of the substrate, and the first measurement method measuring a first structure width at a first height, the first height being set, comprising:

measuring the first structure width of a test structure by using the first measurement method at the first height;

determining at least one further parameter using the first measurement method to completely describe the trapezoidal form of the test structure;

measuring the second structure width of the test structure using the second measurement method;

determining the second height from the first structure width, the first height, the second structure width, and from the at least one further parameter; and setting the measuring height of the first measurement method to the second height of the second measurement method.

2. The method as claimed in claim 1, the second measurement method being at least one of a method of electron beam microscopy and the first measurement method being an optical measurement method based on ellipsometry or reflectometry.

3. The method as claimed in claim 1, the at least one parameter for determining the trapezoidal form of the test structure comprising at least one of the sidewall angle and the structure width at a further height.

4. The method as claimed in claim 1, the determination of the at least one further parameter in the first measurement method being based on an underlying model.

* * * * *